United States Patent
Lu et al.

(10) Patent No.: US 10,050,146 B2
(45) Date of Patent: Aug. 14, 2018

(54) SEMICONDUCTOR DEVICE AND METHOD OF FORMING THE SAME

(71) Applicant: United Microelectronics Corp., Hsinchu (TW)

(72) Inventors: Man-Ling Lu, Taoyuan County (TW); Yu-Hsiang Hung, Tainan (TW); Chung-Fu Chang, Tainan (TW); Yen-Liang Wu, Taipei (TW); Wen-Jiun Shen, Yunlin County (TW); Chia-Jong Liu, Pingtung County (TW); Ssu-I Fu, Kaohsiung (TW); Yi-Wei Chen, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 728 days.

(21) Appl. No.: 14/462,114

(22) Filed: Aug. 18, 2014

(65) Prior Publication Data

US 2016/0020110 A1   Jan. 21, 2016

(30) Foreign Application Priority Data

Jul. 17, 2014  (CN) .......................... 2014 1 0341635

(51) Int. Cl.
*H01L 29/78* (2006.01)
*H01L 29/66* (2006.01)
*H01L 21/308* (2006.01)

(52) U.S. Cl.
CPC ...... *H01L 29/7848* (2013.01); *H01L 21/3086* (2013.01); *H01L 29/6656* (2013.01); *H01L 29/66545* (2013.01); *H01L 29/66636* (2013.01); *H01L 29/78* (2013.01)

(58) Field of Classification Search
CPC ............. H01L 29/6656; H01L 29/7848; H01L 21/3086; H01L 29/78; H01L 29/66545; H01L 29/66636; H01L 21/28141–21/2815; H01L 21/823468; H01L 21/823864
See application file for complete search history.

(56) References Cited

U.S. PATENT DOCUMENTS

| | | | |
|---|---|---|---|
| 9,093,467 B1 * | 7/2015 | Xie | H01L 29/66545 |
| 9,406,687 B1 * | 8/2016 | Yang | H01L 27/11524 |
| 2013/0248949 A1 * | 9/2013 | Kirkpatrick | H01L 21/823864 257/288 |
| 2014/0246729 A1 * | 9/2014 | Jang | H01L 27/092 257/377 |
| 2014/0369115 A1 * | 12/2014 | Kim | H01L 29/78 365/182 |

* cited by examiner

*Primary Examiner* — Cuong B Nguyen
(74) *Attorney, Agent, or Firm* — J.C. Patents

(57) ABSTRACT

A method of forming a semiconductor device is provided. At least one stacked structure is provided on a substrate. A first spacer material layer, a second spacer material layer, and a third spacer material layer are sequentially formed on the substrate and cover the stacked structure. The first, second, and third spacer material layers are etched to form a tri-layer spacer structure on the sidewall of the stacked structure. The tri-layer spacer structure includes, from one side of the stacked structure, a first spacer, a second spacer, and a third spacer, and a dielectric constant of the second spacer is less than each of a dielectric constant of the first spacer and a dielectric constant of the third spacer.

5 Claims, 3 Drawing Sheets

SEMICONDUCTOR DEVICE AND METHOD OF FORMING THE SAME

CROSS-REFERENCE TO RELATED APPLICATION

This application claims the priority benefit of Chinese application serial no. 201410341635.8, filed on Jul. 17, 2014. The entirety of the above-mentioned patent application is hereby incorporated by reference herein and made a part of this specification.

BACKGROUND

Field of the Invention

The invention relates to an integrated circuit and a method of forming the same, and more particularly, to a semiconductor device and a method of forming the same.

Description of Related Art

In the field of integrated circuit devices, the device dimension is often reduced to ensure high operating speed and low power consumption. However, due to the increasing level of integration of the devices, the minimization of the device dimension reaches its limitations. One proposed solution to overcome the limitations imposed by said device miniaturization is strain engineering.

Strain engineering is to utilize materials with the same crystalline structure but different lattice constants for achieving the purpose of controlling the strain. In most cases, recesses are formed in a substrate beside a gate, and a strain layer is formed in the recesses. If the transistor is an n-type transistor, the strain layer can be a SiC epitaxial layer. If the transistor is a p-type transistor, the strain layer can be a SiGe epitaxial layer. Unfortunately, the integration of the SiGe/SiC strain layer into the CMOS manufacturing process raises certain issues, e.g., in the process of forming the recesses in the substrate beside the gate, the existing spacer cannot effectively block etchant, such that the gate may be damaged.

SUMMARY OF THE INVENTION

The invention is directed to a semiconductor device and a method of forming the same. Specifically, a tri-layer spacer structure is formed on a sidewall of a gate, wherein each of the inner and outer spacers has a higher etching resistance than the middle spacer does, so as to protect the middle spacer as well as prevent the gate from being damaged.

The invention provides a method of forming a semiconductor device. At least one stacked structure is provided on a substrate. A first spacer material layer, a second spacer material layer, and a third spacer material layer are sequentially formed on the substrate and cover the stacked structure. The first spacer material layer, the second spacer material layer, and the third spacer material layer are etched, so as to form a tri-layer spacer structure on a sidewall of the stacked structure. Here, the tri-layer spacer structure includes, from one side of the stacked structure, a first spacer, a second spacer and a third spacer, and a dielectric constant of the second spacer is less than each of a dielectric constant of the first spacer and a dielectric constant of the third spacer.

According to an embodiment of the invention, the dielectric constant of the first spacer, the dielectric constant of the second spacer, and the dielectric constant of the third spacer are all less than about 7.

According to an embodiment of the invention, the second spacer includes SiCON, SiBCN, or SiCOH.

According to an embodiment of the invention, the first spacer and the third spacer include the same material.

According to an embodiment of the invention, each of the first spacer and the third spacer includes SiCN.

According to an embodiment of the invention, a carbon content of the first spacer is substantially greater than about 10 wt % of a total weight of the first spacer, and a carbon content of the third spacer is substantially greater than about 10 wt % of a total weight of the third spacer.

According to an embodiment of the invention, each of the first spacer and the third spacer has a higher etching resistance to diluted hydrofluoric acid (DHF) or phosphoric acid ($H_3PO_4$) than the second spacer does.

According to an embodiment of the invention, a method of forming the first, second, and third spacer material layers includes: transferring the substrate into a first chamber; introducing a first precursor into the first chamber to form the first spacer material layer; transferring the substrate from the first chamber to a second chamber; introducing a second precursor into the second chamber to form the second spacer material layer; transferring the substrate from the second chamber back to the first chamber; and introducing the first precursor into the first chamber to form the third spacer material layer.

According to an embodiment of the invention, after the first spacer material layer is formed, a treatment is performed to a surface portion of the first spacer material layer with use of an oxygen-containing species, a boron-containing species or a combination thereof, so that the surface portion is transformed into the second spacer material layer.

According to an embodiment of the invention, a method of forming the first, second, and third spacer material layers includes: introducing a first precursor into a chamber; introducing a second precursor into the chamber after the first precursor is introduced into the chamber for a first period of time; stopping the second precursor after the second precursor is introduced into the chamber for a second period of time; and constantly introducing the first precursor into the chamber for a third period of time.

According to an embodiment of the invention, the second precursor includes an oxygen-containing species, a boron-containing species or a combination thereof.

According to an embodiment of the invention, a method of etching the first, second, and third spacer material layers includes performing an anisotropic etching process.

The invention further provides a semiconductor device including at least one stacked structure and a tri-layer spacer structure. The stacked structure is located on a substrate. The tri-layer spacer structure is located on a sidewall of the stacked structure. The tri-layer spacer structure includes, from one side of the stacked structure, a first spacer, a second spacer and a third spacer, and a dielectric constant of the second spacer is less than each of a dielectric constant of the first spacer and a dielectric constant of the third spacer. Besides, the dielectric constant of the first spacer, the dielectric constant of the second spacer, and the dielectric constant of the third spacer are all less than about 7.

According to an embodiment of the invention, the second spacer includes SiCON, SiBCN, or SiCOH.

According to an embodiment of the invention, the first spacer and the third spacer include the same material.

According to an embodiment of the invention, each of the first spacer and the third spacer includes SiCN.

According to an embodiment of the invention, a carbon content of the first spacer is substantially greater than about 10 wt % of a total weight of the first spacer, and a carbon content of the third spacer is substantially greater than about 10 wt % of a total weight of the third spacer.

According to an embodiment of the invention, a thickness of the second spacer is greater than each of a thickness of the first spacer and a thickness of the third spacer.

According to an embodiment of the invention, each of the first spacer and the third spacer has a higher etching resistance to DHF or $H_3PO_4$ than the second spacer does.

In view of the above, a tri-layer spacer structure is formed on the sidewall of the stacked structure, wherein each of the inner first spacer and the outer third spacer has a higher etching resistance than the middle second spacer does; hence, the middle second spacer can be protected, and the gate-to-contact parasitic capacitance can be reduced. In the meantime, possible damages to the gate can be prevented, and the device performance can be improved.

Several exemplary embodiments accompanied with figures are described in detail below to further describe the invention in details.

DETAILED DESCRIPTION OF DISCLOSED EMBODIMENTS

FIG. 1A to FIG. 1D are schematic cross-sectional views illustrating a method of forming a semiconductor device according to an embodiment of the invention.

Figure 1A:
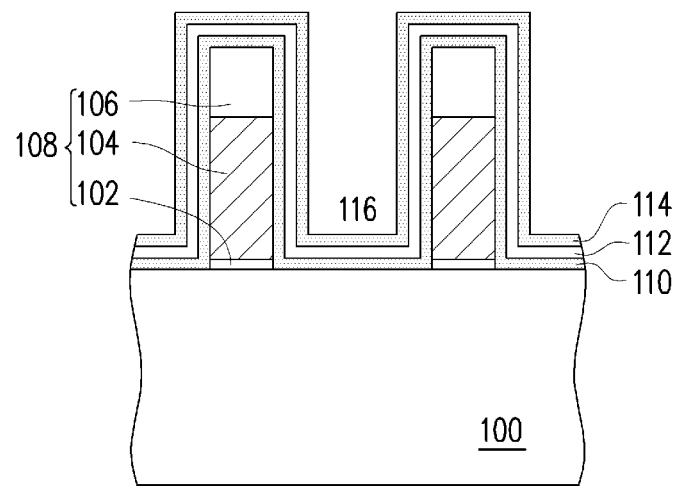
FIG. 1A to FIG. 1D are schematic cross-sectional views illustrating a method of forming a semiconductor device according to an embodiment of the invention.

With reference to FIG. 1A, at least one stacked structure 108 is provided on a substrate 100. The substrate 100 is a semiconductor substrate, e.g., a silicon substrate. Each stacked structure 108 includes an interfacial layer 102, a gate 104, and a cap layer 106 sequentially disposed on the substrate 100. The interfacial layer 102 includes silicon oxide, silicon nitride, a high-k material with a dielectric constant greater than 4, or a combination thereof. The high-k material can be metal oxide, e.g., rare-earth metal oxide. Besides, the high-k material can be selected from the group consisting of hafnium oxide ($HfO_2$), hafnium silicon oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, i.e., SBT), lead zirconate titanate ($PbZr_xTi_{1-x}O_3$, i.e., PZT), and barium strontium titanate ($Ba_xSr_{1-x}TiO_3$, i.e., BST), wherein x is between 0 and 1. The gate 104 includes a silicon-containing material (e.g., amorphous silicon or polysilicon) or metal (e.g., aluminum). The cap layer 106 includes silicon oxide, silicon nitride, silicon oxynitride, or a combination thereof.

According to an embodiment of the invention, for a polysilicon gate process, each stacked structure 108 may include a silicon oxide layer or a silicon oxynitride layer as the interfacial layer 102 (or called a gate dielectric layer), a polysilicon layer as the gate 104, and a silicon nitride layer as the cap layer 106.

According to another embodiment of the invention, for a high-k first metal gate process, each stacked structure 108 may include a composite layer (containing a lower silicon oxide layer and an upper high-k layer) as the interfacial layer 102, a polysilicon layer as the dummy gate 104, and a silicon nitride layer as the cap layer 106. Each stacked layer 108 may further include a barrier layer located between the high-k layer and the polysilicon layer. Here, the barrier layer includes TiN.

According to still another embodiment of the invention, for a high-k last metal gate process, each stacked structure 108 may include a silicon oxide layer as the interfacial layer 102, a polysilicon layer as the dummy gate 104, and a silicon nitride layer as the cap layer 106.

As shown in FIG. 1A, a first spacer material layer 110, a second spacer material layer 112, and a third spacer material layer 114 are sequentially formed on the substrate 100 and cover the stacked structures 108. Besides, a dielectric constant of the second spacer material layer 112 is less than each of a dielectric constant of the first spacer material layer 110 and a dielectric constant of the third spacer material layer 114. According to an embodiment of the invention, the dielectric constant of the first spacer material layer 110, the dielectric constant of the second spacer material layer 112, and the dielectric constant of the third spacer material layer 114 are all less about than 7. For instance, the second spacer material layer 112 includes SiCON with a dielectric constant of about 5, SiBCN with a dielectric constant of about 5.2, or SiCOH with a dielectric constant of about 3-2.5; and each of the first and third spacer material layers 110 and 114 includes SiCN with a dielectric constant of about 6.9. In addition, the material of the first spacer material layer 110 may be the same as or different from the material of the third spacer material layer 114.

In an embodiment of the invention, a method of forming the first spacer material layer 110, the second spacer material layer 112, and the third spacer material layer 114 includes following steps. First, the substrate 100 is transferred into a first chamber. A first precursor is introduced into the first chamber to form the first spacer material layer 110. The substrate 100 is then transferred from the first chamber to a second chamber. A second precursor is introduced into the second chamber to form the second spacer material layer 112. The substrate 100 is transferred from the second chamber back to the first chamber, and the first precursor is again introduced into the first chamber to form the third spacer material layer 114. An appropriate deposition process, e.g., a chemical vapor deposition (CVD) process, a physical vapor deposition (PVD) process, or an atomic layer deposition (ALD) process, may be performed in the first chamber and the second chamber. According to an embodiment of the invention, the first chamber and the second chamber are different chambers in one machine, and therefore the method of forming the first spacer material layer 110, the second spacer material layer 112, and the third spacer material layer 114 can be regarded as an in-situ deposition method. According to another embodiment of the invention, the first chamber and the second chamber are different chambers in different machines, and therefore the method of forming the first spacer material layer 110, the second spacer material layer 112, and the third spacer material layer 114 can be regarded as an ex-situ deposition method. Here, the substrate 100 is transferred between different chambers, so as to form the sandwich-like spacer structure, which should however not be construed as a limitation to the invention.

Figure 2:
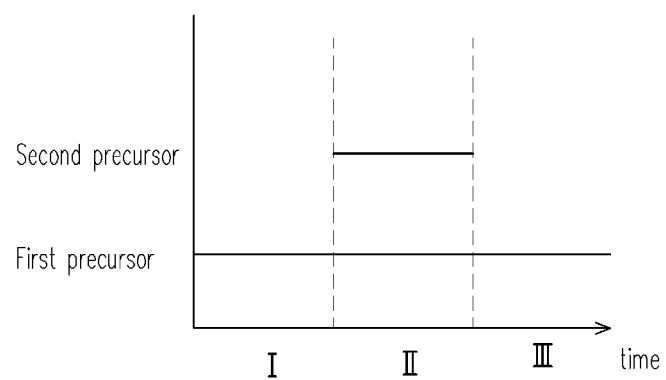
FIG. 2 is a graph illustrating a relationship between the supply of each precursor and time.

In another embodiment of the invention, the sandwich-like spacer structure can be formed in the same chamber. With reference to FIG. 2, a first precursor is introduced into a chamber. After the first precursor is introduced into the chamber for a first period of time I, a second precursor is introduced into the chamber. After the second precursor is introduced into the chamber for a second period of time II, the supply of the second precursor is stopped. The first precursor is constantly introduced into the chamber for a third period of time III. In particular, the first precursor is introduced into the chamber in all of the first, second, and third periods of time I, II, and III, while the second precursor is introduced into the chamber only in the second period of time II. The first precursor can be precursor(s) for forming SiCN, and the second precursor can be an oxygen-containing species, a boron-containing species or a combination thereof; therefore, the SiCN/SiCOH/SiCN or SiCN/SiBCH/SiCN sandwich-like spacer structure can be formed. Here, the oxygen-containing species may include $O_2$ or $O_3$, and the boron-containing species may include $B_2H_6$.

In still another embodiment of the invention, after the first spacer material layer 110 (e.g., made by SiCN) is formed, a treatment may be performed to a surface portion of the first spacer material layer 110 with use of an oxygen-containing species, a boron-containing species or a combination thereof, so that the surface portion is transformed into the second spacer material layer 112 (e.g., made by SiCON or SiBCN). The treatment may include a heat treatment or a plasma treatment. The oxygen-containing species may include $O_2$ or $O_3$, and the boron-containing species may include $B_2H_6$. The third spacer material layer 114 is then formed on the second spacer material layer 112.

Figure 1B:
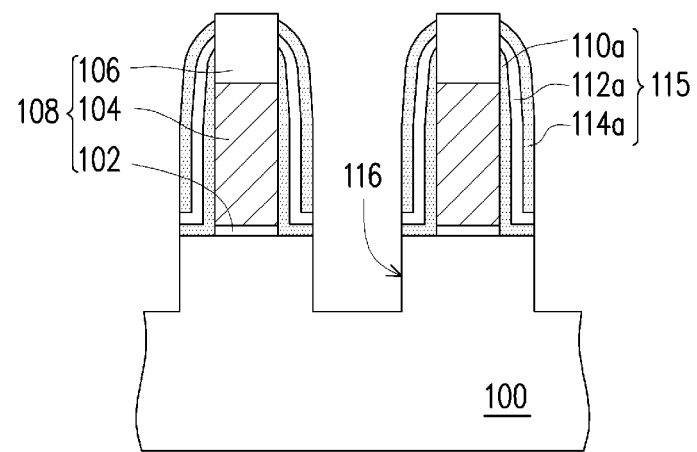

With reference to FIG. 1B, the first spacer material layer 110, the second spacer material layer 112, and the third spacer material layer 114 are etched, so as to form a tri-layer spacer structure 115 on a sidewall of each stacked structure 108. Here, the tri-layer spacer structure 115 includes, from one side of the stacked structure 108, a first spacer 110a, a second spacer 112a and a third spacer 114a. The etching process may be an anisotropic etching process, for instance.

So far, a semiconductor device that includes at least one stacked structure 108 and the tri-layer spacer structure 115 can be formed. The stacked structure 108 is disposed on the substrate 100. The tri-layer spacer structure 115 is disposed on the sidewall of the stacked structure 108, and a dielectric constant of the middle second spacer 112a is less than each of a dielectric constant of the inner first spacer 110a and a dielectric constant of the outer third spacer 114a. The arrangement of the middle spacer (e.g., the second spacer 112a) with a dielectric constant less than about 5.5 is beneficial to effective reduction of the gate-to-contact parasitic capacitance.

According to an embodiment of the invention, the first and third spacers 110a and 114a are made of the same material, and thus the sandwiched-like spacer structure can be formed, e.g., one low-k material layer (with a dielectric constant less than about 5.5) is sandwiched by inner and outer high-k material layers (each with a dielectric constant less about than 7).

In an embodiment of the invention, a thickness of the second spacer 112a is greater than each of a thickness of the first spacer 110a and a thickness of the third spacer 114a, which should however not be construed as a limitation to the invention. According to another embodiment of the invention, the thickness of the second spacer 112a may be less than or equal to at least one of the thickness of the first spacer 110a and the thickness of the third spacer 114a.

Note that, each of the first spacer 110a and the third spacer 114a (e.g., a SICN spacer) has a higher etching resistance to DHF or $H_3PO_4$ than the second spacer 112a (e.g., a SiCON spacer) does, and thus the second spacer 112a and the gate 104 can be effectively protected from being etched in the subsequent wet etching steps. As shown in Table 1, SiCN has a higher etching resistance to DHF or $H_3PO_4$ than SiCON does.

TABLE 1

|  | Wet Etching Rate (Å/minutes) | |
| --- | --- | --- |
|  | SiCON | SiCN |
| DHF | 5.3 | 0.91 |
| $H_3PO_4$ | 1.05 | 0.8 |
| Dielectric Constant | ~5 | ~6.9 |

According to an embodiment of the invention, a carbon content of the first spacer 110a is substantially greater than about 10 wt % of a total weight of the first spacer 110a, and a carbon content of the third spacer 114a is substantially greater than about 10 wt % of a total weight of the third spacer 114a.

A portion of the substrate 100 is then removed with use of the tri-layer spacer structure 115 and the cap layer 106 as a mask, so as to form two recesses 116 in the substrate 100 beside each stacked structure 108. In an embodiment of the invention, one recess 116 is formed in the substrate 110 between the adjacent stacked structures 108. A method of removing the portion of the substrate 100 includes a step of performing a dry etching process to form the recesses 116 and a step of performing a wet cleaning process (i.e., a wet cleaning post recess step) to remove residues. The etchant used in the wet cleaning post recess step includes DHF. In the present embodiment, the resultant recesses 116 have the substantially vertical sidewalls, as shown in FIG. 1B, while the invention is not limited thereto. In another embodiment, another wet etching process may be performed with use of tetramethylammonium hydroxide (TMAH) or KOH alkaline solutions, so as to enlarge the middle portion of each recess 116; thereby, the width of the middle portion of each recess 116 is greater than the width of each of the top and bottom portions of the recess 116. In this embodiment, since the tri-layer spacer structure 115 is disposed on the sidewall of each stacked structure 108, and each of the inner first spacer 110a and the outer third spacer 114a has a higher etching resistance to DHF than the middle second spacer 112a does, the middle second spacer 112a can be protected, and the gate-to-contact parasitic capacitance can be further reduced.

Figure 1C:
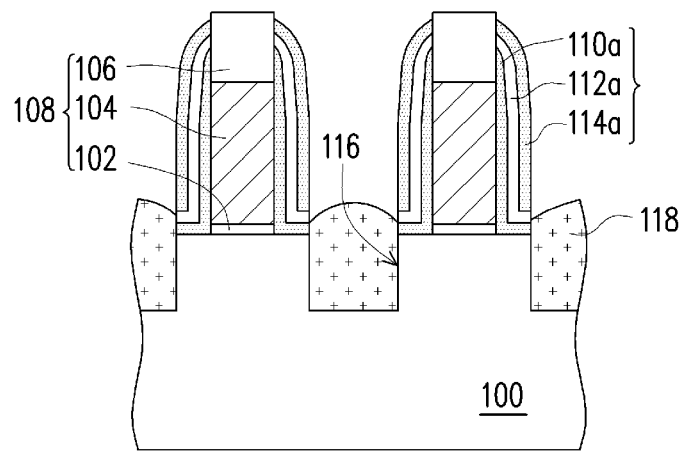

With reference to FIG. 1C, strain layers 118 are formed in the recesses 116, and the adjacent stacked structures 108 share one strain layer 118. The strain layers 118 include SiGe, SiC or SiP, and a method of forming the strain layers 118 includes performing a selective epitaxy growth (SEG) process. Besides, each strain layer 118 covers a portion of the sidewall of the corresponding tri-layer spacer structure 115. The strain layers 118 may serve as source/drain regions of the device and may include doped regions therein. In an embodiment, each strain layer 118 may be a combination of a p-type doped region and a SiGe layer. In another embodiment, each strain layer 118 may be a combination of an n-type doped region and a SiC layer or a SiP layer. The p-type doped region and the n-type doped region can be formed by an ion implantation process.

After the steps shown in FIG. 1A to FIG. 1C are performed, for a polysilicon gate process, the gate and the source/drain regions of the device have been completed.

However, for a high-k first or high-k last metal gate process, a subsequent step of removing the dummy gate is required.

Figure 1D:
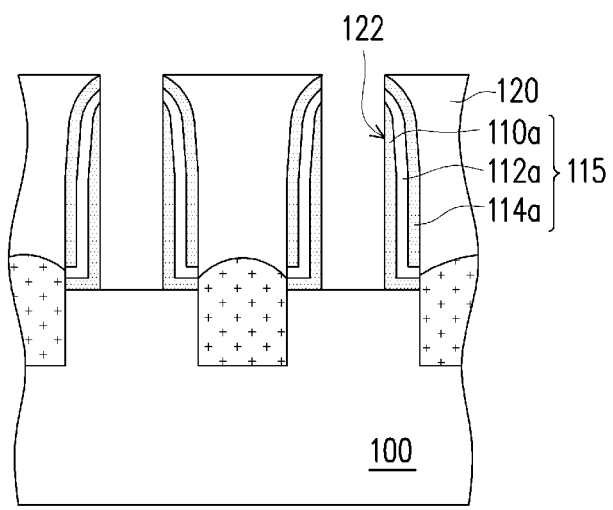

With reference to FIG. 1D, a dielectric layer 120 is formed on the substrate 100, and the top surface of each stacked structure 108 is exposed by the dielectric layer 120. The dielectric layer 120 includes silicon oxide, silicon nitride, silicon oxynitride or a combination thereof, and a method of forming the dielectric layer 120 includes forming a dielectric material layer on the substrate 100 covering the stacked structures 108. A chemical-mechanical polishing (CMP) process is then carried out with use of the cap layer 106 as a polishing stop layer, so as to remove a portion of the dielectric material layer.

At least one portion of each stacked structure 108 is then removed to form an opening 122 in the dielectric layer 120. According to an embodiment of the invention, for a high-k last metal gate process, the entire stacked structure 108 need be removed, i.e., the cap layer 106, the dummy gate 104, and the interfacial layer 102 are removed, as shown in FIG. 1D. According to another embodiment of the invention, for a high-k first metal gate process, only the cap layer 106 and the dummy gate 104 in the stacked structure 108 need be removed. A method of removing the at least one portion of each stacked structure 108 includes performing a wet etching process, and the etchant used herein includes $H_3PO_4$. In this embodiment, since the tri-layer spacer structure 115 is disposed on the sidewall of each stacked structure 108, and each of the inner first spacer 110a and the outer third spacer 114a has a higher etching resistance to $H_3PO_4$ than the middle second spacer 112a does, variation to the opening 122 can be prevented, and the device performance can be further improved.

After the openings 122 is formed, steps of forming gate dielectric layers, metal gates, and contacts may be further performed; these steps are well known to people having ordinary skill in the art, and thus the details are not iterated.

To sum up, a sandwich-like spacer structure is formed on the sidewall of each stacked structure, and the sandwich-like spacer structure includes a middle spacer (e.g., the second spacer 112a) with a dielectric constant less than about 5.5; thereby, the gate-to-contact parasitic capacitance can be effectively reduced. In addition, each of the inner first spacer 110a and the outer third spacer 114a (e.g., a SiCN spacer) has a higher etching resistance to DHF and $H_3PO_4$ than the middle second spacer 112a (e.g., a SiCON spacer) does; therefore, the middle spacer can be protected, damages to the gate can be prevented, and device performance can be further improved. Moreover, the carbon content of the SiCN spacers at two sides is substantially greater than about 10 wt % of the total weight of the SiCN spacers, such that the protective effects of the sandwich-like spacer structure can be further enhanced.

To be specific, the outermost spacer (e.g., the third spacer 114a) of the sandwich-like spacer structure can effectively block the etchant (e.g., DHF) in the wet cleaning post recess step, such that the effective thickness of the middle low-k spacer can be maintained, and the gate-to-contact parasitic capacitance can be accordingly reduced. Besides, in the step of removing the dummy gate, the innermost spacer (e.g., the first spacer 110a) of the sandwich-like spacer structure can effectively block the etchant (e.g., $H_3PO_4$), and thus the critical dimension of the subsequently formed metal gate can be effectively controlled. Therefore, as compared to the conventional single-layer or double-layer spacer structure, the sandwich-like spacer structure provided herein can accomplish favorable protective effects, and the device performance can be effectively improved.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A semiconductor device, comprising:
   at least one stacked structure, disposed on a substrate; and
   a tri-layer spacer structure, disposed on a sidewall of the at least one stacked structure, wherein the tri-layer spacer structure comprises, from one side of the at least one stacked structure, a first spacer, a second spacer and a third spacer, and a dielectric constant of the second spacer is less than each of a dielectric constant of the first spacer and a dielectric constant of the third spacer,
   wherein the dielectric constant of the first spacer is less than about 7, the dielectric constant of the second spacer is less than about 7, and the dielectric constant of the third spacer is less than about 7,
   wherein a thickness of the second spacer is greater than each of a thickness of the first spacer and a thickness of the third spacer,
   wherein the at least one stacked structure comprises an interfacial layer and a gate over the interfacial layer, and a bottommost surface of the interfacial layer is substantially coplanar with a bottom surface of the tri-layer spacer structure, and
   wherein the at least one stacked structure further comprises a cap layer over the gate, and a sidewall of the cap layer is directly contacting with the first spacer, the second spacer and the third spacer of the tri-layer spacer structure, respectively.

2. The semiconductor device according to claim 1, wherein the second spacer comprises SiCON, SiBCN, or SiCOH.

3. The semiconductor device according to claim 1, wherein the first spacer and the third spacer comprise the same material.

4. The semiconductor device according to claim 1, wherein each of the first spacer and the third spacer has a higher etching resistance to diluted hydrofluoric acid or $H_3PO_4$ than the second spacer does.

5. A semiconductor device, comprising:
   at least one stacked structure, disposed on a substrate; and
   a tri-layer spacer structure, disposed on a sidewall of the at least one stacked structure, wherein the tri-layer spacer structure comprises, from one side of the at least one stacked structure, a first spacer, a second spacer and a third spacer, and a dielectric constant of the second spacer is less than each of a dielectric constant of the first spacer and a dielectric constant of the third spacer,
   wherein a carbon content of the first spacer is substantially greater than about 10 wt % of a total weight of the first spacer, and a carbon content of the third spacer is substantially greater than about 10 wt % of a total weight of the third spacer, and
   wherein the third spacer is an outermost spacer having higher etching resistance to diluted hydrofluoric acid than that of the second spacer, and the first spacer is an innermost spacer having higher etching resistance to $H_3PO_4$ than that of the second spacer.

* * * * *